US011908958B2

(12) United States Patent
Reich et al.

(10) Patent No.: US 11,908,958 B2
(45) Date of Patent: Feb. 20, 2024

(54) METALLIZATION STRUCTURES FOR SOLAR CELLS

(71) Applicant: Maxeon Solar Pte. Ltd., Singapore (SG)

(72) Inventors: Matthieu Minault Reich, San Jose, CA (US); Seung Bum Rim, Pleasanton, CA (US)

(*) Notice: Subject to any disclaimer, the term of this patent is extended or adjusted under 35 U.S.C. 154(b) by 316 days.

(21) Appl. No.: 15/396,246

(22) Filed: Dec. 30, 2016

(65) Prior Publication Data
US 2018/0190837 A1    Jul. 5, 2018

(51) Int. Cl.
*H01L 31/02* (2006.01)
*H01L 31/0224* (2006.01)
*H01L 31/18* (2006.01)
*H01L 31/0368* (2006.01)
*H01L 31/068* (2012.01)
(Continued)

(52) U.S. Cl.
CPC .... *H01L 31/0201* (2013.01); *H01L 31/02167* (2013.01); *H01L 31/02168* (2013.01); *H01L 31/02363* (2013.01); *H01L 31/022433* (2013.01); *H01L 31/022441* (2013.01); *H01L 31/03682* (2013.01); *H01L 31/0682* (2013.01);
(Continued)

(58) Field of Classification Search
CPC ........... H01L 31/0682; H01L 31/03682; H01L 31/0201; H01L 31/022441; H01L 31/022458; H01L 31/0516
See application file for complete search history.

(56) References Cited

U.S. PATENT DOCUMENTS 3,993,533 A   11/1976 Milnes et al.
4,058,418 A   11/1977 Lindmayer
(Continued)

FOREIGN PATENT DOCUMENTS

CN   102132423   7/2011
DE   10020412    11/2001
(Continued)

OTHER PUBLICATIONS

Machine Translation of JP-2006120944; accessed and printed Jan. 17, 2023 (Year: 2006).*
(Continued)

*Primary Examiner* — Lindsey A Buck
(74) *Attorney, Agent, or Firm* — Vanguard/IP LLP; Reginald Ratliff

(57) ABSTRACT

Methods of fabricating a solar cell including metallization techniques and resulting solar cells, are described. In an example, forming a first semiconductor region and a second semiconductor region on the back side of a substrate. A first conductive busbar can be formed above the first semiconductor region. A first portion of a second conductive busbar can be formed above the second semiconductor region. A second portion of the second conductive busbar can be formed above the second semiconductor region, where a separation region separates the second portion and the first portion of the second conductive busbar. A third conductive busbar can be formed above the first semiconductor region. A first conductive bridge can be formed above the separation region, where the first conductive bridge electrically connects the first conductive busbar to the third conductive busbar.

20 Claims, 8 Drawing Sheets

(51) Int. Cl.
*H01L 31/0216* (2014.01)
*H01L 31/0236* (2006.01)

(52) U.S. Cl.
CPC .......... *H01L 31/1876* (2013.01); *Y02E 10/50* (2013.01); *Y02P 70/50* (2015.11)

(56) References Cited

U.S. PATENT DOCUMENTS

| | | |
|---|---|---|
| 4,318,938 A | 3/1982 | Barnett et al. |
| 4,380,112 A | 4/1983 | Little |
| 4,393,576 A | 7/1983 | Dahlberg |
| 4,400,577 A | 8/1983 | Spear |
| 4,433,200 A | 2/1984 | Jester et al. |
| 4,461,922 A | 7/1984 | Gay et al. |
| 4,482,780 A | 11/1984 | Mitchell |
| 4,581,103 A | 4/1986 | Levine et al. |
| 4,582,588 A | 4/1986 | Jensen et al. |
| 4,617,421 A | 10/1986 | Nath et al. |
| 4,691,076 A | 9/1987 | Levine et al. |
| 4,695,674 A | 9/1987 | Bar-on |
| 4,697,041 A | 9/1987 | Okaniwa et al. |
| 4,882,298 A | 11/1989 | Moeller et al. |
| 4,917,752 A | 4/1990 | Jensen et al. |
| 4,957,601 A | 9/1990 | Levine et al. |
| 5,091,319 A | 2/1992 | Hotchkiss et al. |
| 5,380,371 A | 1/1995 | Murakami |
| 5,951,786 A | 9/1999 | Gee et al. |
| 5,980,679 A | 11/1999 | Severin et al. |
| 6,159,832 A | 12/2000 | Mayer |
| 6,288,326 B1 | 9/2001 | Hayashi et al. |
| 6,448,155 B1 | 9/2002 | Iwasaki et al. |
| 6,635,307 B2 | 10/2003 | Huang et al. |
| 7,355,114 B2 | 4/2008 | Ojima et al. |
| 8,003,530 B2 | 8/2011 | Grohe et al. |
| 8,146,643 B2 | 4/2012 | Kasahara et al. |
| 8,766,090 B2 | 7/2014 | Sewell et al. |
| 8,809,192 B2 | 8/2014 | Bertram et al. |
| 9,040,409 B2 | 5/2015 | Kumar et al. |
| 9,496,437 B2 | 11/2016 | Harley et al. |
| 9,640,710 B2 | 5/2017 | Pearce et al. |
| 2005/0253142 A1 | 11/2005 | Negami et al. |
| 2006/0166023 A1 | 7/2006 | Yoshikata et al. |
| 2006/0213548 A1 | 9/2006 | Bachrach et al. |
| 2008/0042153 A1 | 2/2008 | Beeson et al. |
| 2008/0128019 A1 | 6/2008 | Lopatin et al. |
| 2008/0216887 A1 | 9/2008 | Hacke et al. |
| 2008/0223429 A1 | 9/2008 | Everett et al. |
| 2009/0084437 A1* | 4/2009 | Nishida ............. H01L 31/02245 136/256 |
| 2009/0194162 A1 | 8/2009 | Sivaram et al. |
| 2009/0272419 A1* | 11/2009 | Sakamoto ....... H01L 31/022425 136/244 |
| 2010/0032013 A1 | 2/2010 | Krause et al. |
| 2010/0200058 A1 | 8/2010 | Funakoshi |
| 2010/0243041 A1 | 9/2010 | Carlson et al. |
| 2011/0023962 A1* | 2/2011 | Fukui ................ H01L 31/02245 136/256 |
| 2011/0041908 A1* | 2/2011 | Harder ................ H01L 31/0682 136/256 |
| 2011/0100417 A1* | 5/2011 | Jang .................. H01L 31/02167 136/244 |
| 2011/0120530 A1 | 5/2011 | Isaka |
| 2012/0097245 A1 | 4/2012 | Nishina et al. |
| 2012/0103408 A1 | 5/2012 | Moslehi et al. |
| 2012/0211049 A1* | 8/2012 | Kobamoto ........ H01L 31/02245 136/244 |
| 2012/0240995 A1 | 9/2012 | Coakley et al. |
| 2013/0160825 A1 | 6/2013 | Lantzer et al. |
| 2013/0183796 A1 | 7/2013 | Stewart et al. |
| 2015/0004737 A1 | 1/2015 | Harley |
| 2015/0280641 A1 | 10/2015 | Garg et al. |

FOREIGN PATENT DOCUMENTS

| | | | |
|---|---|---|---|
| EP | 1634673 | 3/2006 | |
| JP | 2003/246971 | 9/2003 | |
| JP | 2006120944 A * | 5/2006 | ..... H01L 31/022441 |
| JP | 2007281044 A * | 10/2007 | ..... H01L 31/022441 |
| JP | 2009/130116 | 6/2009 | |
| JP | 2011/054831 | 3/2011 | |
| WO | WO 1999/040760 | 8/1999 | |
| WO | WO 2010/025269 | 3/2010 | |

OTHER PUBLICATIONS

Cotter, et al., "Novel Process for Simplified Buried Contact Solar Cells," Institute of Electrical and Electronics Engineers, Aug. 2000, pp. 303-306.

Gress, et al., "Wire bonding as a cell interconnection technique for polycrystalline silicon thin-film solar cells on glass," Progress in Photovoltaics: Research and Applications, Mar. 11, 2010, pp. 221-228, vol. 18.

Non-final Notice of Reasons for Rejection from Japanese Patent Application No. 2018-182848 dated Oct. 16, 2019, 7 pgs.

* cited by examiner

METALLIZATION STRUCTURES FOR SOLAR CELLS

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

DETAILED DESCRIPTION

Figure 1:
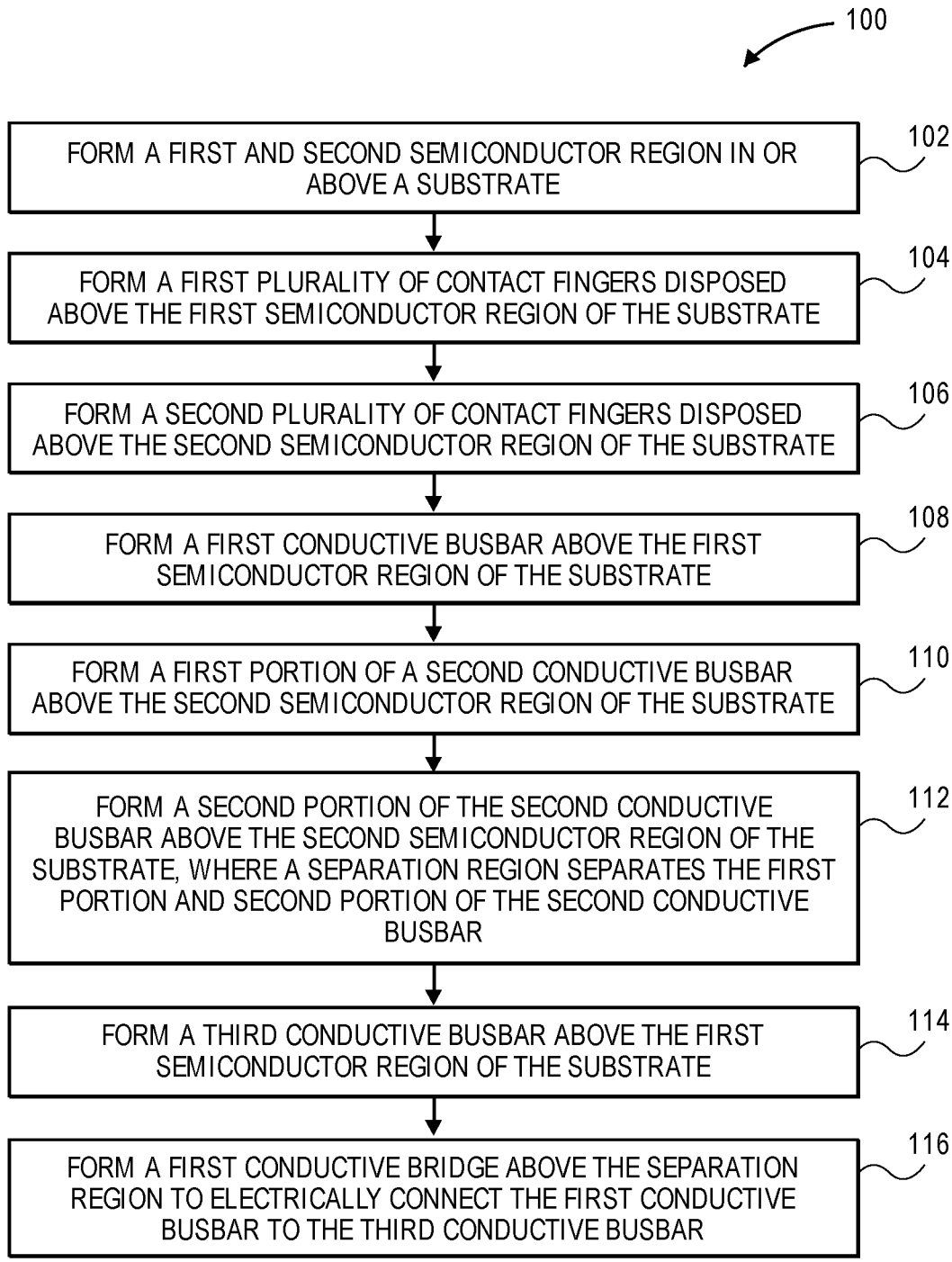
FIG. 1 is a flowchart listing operations in a method of metallization and/or a stringing method for solar cells, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" conductive busbar does not necessarily imply that this conductive busbar is the first conductive busbar in a sequence; instead the term "first" is used to differentiate this conductive busbar from another conductive busbar (e.g., a "second" solar cell). In an embodiment, a conductive busbar can be a conductive contact region located on a back side of the solar cell. In one embodiment, a conductive busbar can have a thickness that is greater than a thickness of a contact finger. In one example, the thickness of the conductive busbar can be in the range of 50-250 microns and the thickness of the contact fingers can be 10-50 microns. As used herein, conductive contact fingers and/or conductive contact regions can be used interchangeably with contact fingers.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Metallization methods for solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Improvements in metallization methods for forming conductive contacts of solar cells are generally desirable. In contrast to some metallization methods, e.g., plating conductive contacts on a solar cell, other techniques can include bonding conductive foil to a semiconductor substrate (e.g., a silicon substrate). Techniques described herein provide for novel methods and apparatus to form conductive busbars on a semiconductor substrate in a solar cell metallization process. Various examples are provided throughout.

FIG. 1 illustrates a flowchart 100 listing operations in a method of fabricating for a solar cell 200 as corresponding to FIGS. 2A, 2B, 2C and 2D, according to some embodiments.

At 102, a first semiconductor region and a second semiconductor region can be formed in or above a substrate. In an example, the substrate can be a semiconductor substrate. In one example, the substrate is a silicon substrate. In an example, forming the first and second semiconductor regions can include forming an N-type and/or a P-typed emitter regions. In an embodiment, forming the first and/or second semiconductor regions can include performing a deposition process such as, but not limited to, plasma-enhanced chemical vapor deposition (PECVD), low pressure chemical vapor deposition (LPCVD), or sputtering (physical vapor deposition, PVD).

At 104, 106 a plurality of contact fingers can be formed above the semiconductor regions of the substrate. In an embodiment, a first plurality of contact fingers can be formed above the second semiconductor region of the substrate. In one embodiment, a second plurality of contact fingers can be formed above the second semiconductor region of the substrate. In an embodiment, the first plurality and/or second plurality of contact fingers can be formed from a metal seed layer using a blanket deposition process. In that embodiment, the metal seed layer may be patterned in a subsequent etching process, such as a hydroxide-based wet etching process to form the first plurality and/or second plurality of contact fingers. In some embodiments, the first plurality and/or second plurality of contact fingers can be formed from a patterned metal seed region (e.g., a patterned metal seed layer). In an example, a patterned metal seed region can be formed by deposited using a printing process (e.g., through screen printing) and a subsequent curing process. In an embodiment, forming the first and second plurality of contact fingers can include depositing a metal such as, but not limited to aluminum, nickel, silver, cobalt, copper, titanium and tungsten above the first and/or second semiconductor regions. In an embodiment, the first and second plurality of contact fingers can be formed on some portions of the first and second semiconductor region, where other portions of the first and second semiconductor can be exposed (e.g., the first and second plurality of contact fingers are formed as horizontal strips as shown in FIG. 2B).

At 108, a first conductive busbar can be formed above the first semiconductor region of the substrate. In an embodiment, forming the first conductive busbar can include placing a conductive foil above the first plurality of contact fingers and subsequently bonding the conductive foil to the first plurality of contact fingers. In one embodiment, forming the first conductive busbar can include plating a metal to the first plurality of contact fingers. In an example, the plating process can include plating using copper, nickel, and tin, among other metals.

At 110, 112, a first and second portion of a second conductive busbar can be formed above the second semiconductor region of the substrate. In an embodiment, separation regions can separate the first portion and the second portion of the second conductive busbar. In one embodiment, the first and second portion of the first conductive busbar can be formed in the same process or in separates process steps. In an embodiment, forming the first and second portion of a second conductive busbar can include placing a conductive foil above the first plurality of contact fingers and subsequently bonding the conductive foil to the first plurality of contact fingers. In one embodiment, forming the first and second portions of the second conductive busbar can include plating a metal to the first plurality of contact fingers. In an example, the plating process can include plating using copper, nickel, and tin, among other metals.

At 114, a third conductive busbar can be formed above the first semiconductor region of the substrate. In an embodiment, forming the third conductive busbar can include placing a conductive foil above the first plurality of contact fingers and subsequently bonding the conductive foil to the first plurality of contact fingers. In one embodiment, forming the third conductive busbar can include plating a metal to the first plurality of contact fingers. In an example, the plating process can include plating using copper, nickel, and tin, among other metals.

Forming the first, second and/or third conductive busbars can include placing a conductive foil above the first and second plurality of contact fingers and bonding the first, second and/or third conductive busbars to the first and second plurality of contact fingers. In an example, an aluminum foil can be bonded to the first and second contact fingers. In one such example, the bonding process can include performing a laser welding process, thermocompression process, ultrasonic bonding process, among other bonding processes. In one embodiment, forming the first, second and third conductive busbars can include plating a metal to the first and second contact fingers. In an example, a plating process can be performed to form the first, second and third conductive busbars.

At 116, a first conductive bridge can be formed above the separation region to electrically connect the first conductive busbar to the third conductive busbar. In an embodiment, the first conductive bridge can be formed in the same or substantially similar process to the first and second contact fingers, e.g., by forming a metal seed layer, placing and bonding a conductive foil or performing a plating process.

Figure 2A:
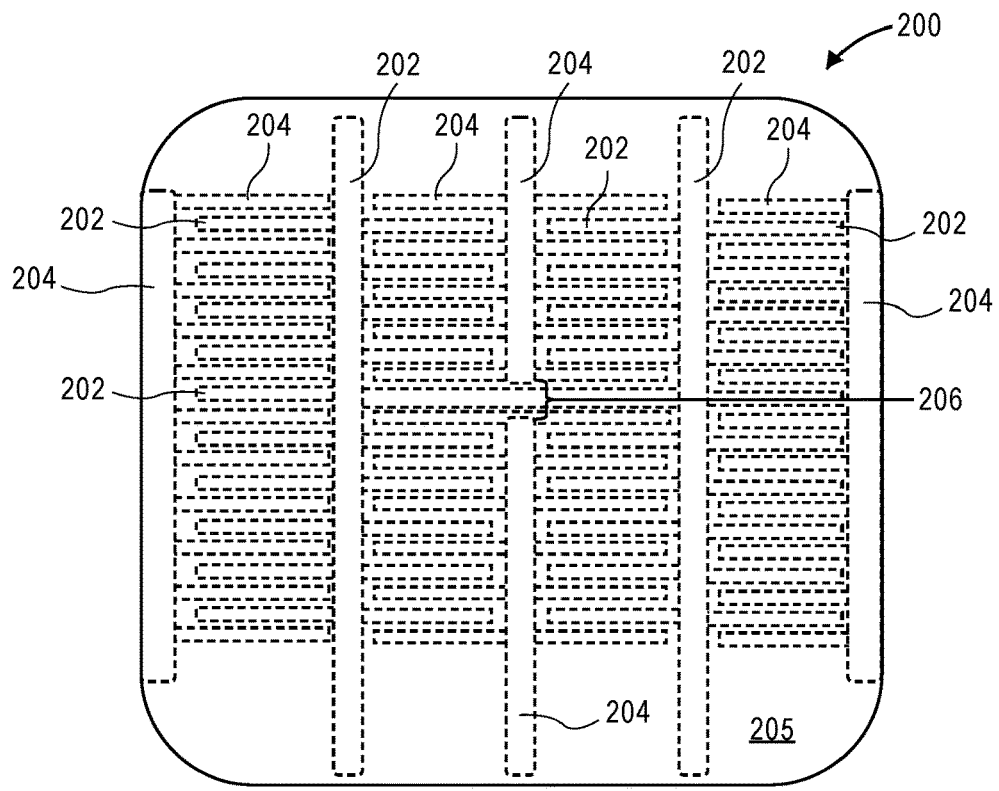
FIGS. 2A, 2B and 2C illustrate views of various stages in a metallization method for solar cells, corresponding to the operations in the method of FIG. 1, according to some embodiments.
Figure 2B:
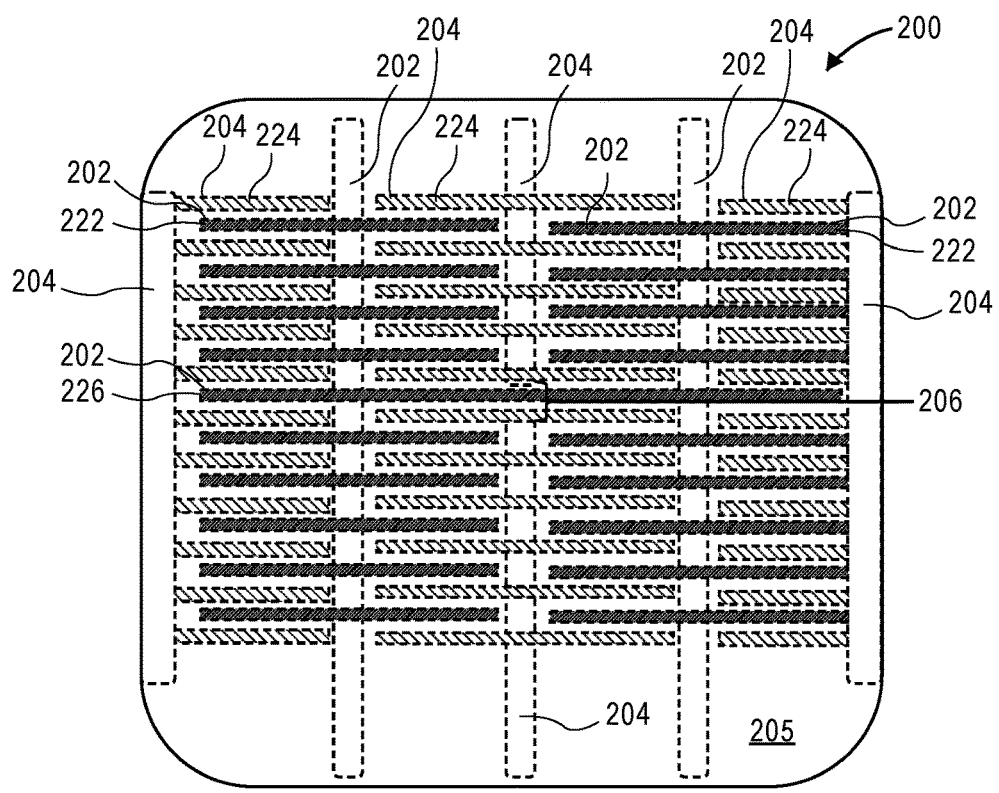

Referring to FIG. 2A and corresponding operation 102 from the flowchart 100 of FIG. 1, a first semiconductor region 202 and/or a second semiconductor region 204 can be formed in or above a substrate 205. In an example, the substrate 205 can be a semiconductor substrate. In one example, the substrate 205 is a silicon substrate. In an embodiment, the substrate 205 is a monocrystalline silicon substrate, such as a bulk single crystalline N-type doped silicon substrate. It is to be appreciated, however, that substrate 205 may be a layer, such as a multi-crystalline silicon layer, disposed on a global solar cell substrate. In an embodiment a first and second semiconductor region 202, 204 can be formed in or above a back surface of a substrate 205. As used herein, back surface can be used interchangeably with back side. In an example, a first and second semiconductor region 202, 204 can be a plurality of alternating N-type and P-type emitter regions formed in or above the substrate 205. In an embodiment, the first and second semiconductor regions 202, 204 can form vertical and horizontal shaped patterns, as shown in FIG. 2A. In an embodiment, some portions of the first and second semiconductor regions 202, 204 can be perpendicular to other portions, as shown. Although, in one example, the first and second semiconductor regions 202, 204 are shown to form a plurality of rectangular patterns, other patterns can be used. In one such example, the first and second semiconductor regions 202, 204 can be patterned in a plurality of circular shapes, oblong shapes, among other patterns.

Referring to FIG. 2B and corresponding operation 104, 106 from the flowchart 100 of FIG. 1, a first plurality of contact fingers 222 and/or a second plurality of contact fingers 224 can be formed above the first semiconductor region 202 and/or second semiconductor region 204, respectively. The first and second plurality of contact fingers 222, 224 can make direct contact to the first and second semiconductor regions 202, 204.

In an embodiment, the first and second plurality contact fingers 222, 224 are metal seed material regions. In an example, metal seed material regions can be metal regions formed from a metal seed layer using a blanket deposition process and/or a printing process (e.g., screen printing) as discussed above. In an embodiment, the first and second plurality of contact fingers 222, 224 can include a metal such as, but not limited to aluminum, nickel, silver, cobalt, copper, titanium and tungsten.

As shown in FIG. 2B, the first and second plurality of contact fingers 222, 224 can be formed on some portions of the first and second semiconductor region 202, 204, where other portions of the first and second semiconductor can be exposed (e.g., the first and second plurality of contact fingers 222, 224 are formed as horizontal strips as shown in FIG. 2B). In one embodiment, the first and second plurality of contact fingers can instead be formed above the first and second semiconductor regions without any exposed regions, e.g., following the pattern shown in FIG. 2A for the first and second semiconductor regions 202, 204. In one such example, a blanket deposition process and/or a printing process can be used to blanket deposit the first and second plurality of contact fingers above the pattern of first and second semiconductor portions 202, 204 shown in FIG. 2A.

Figure 3A:
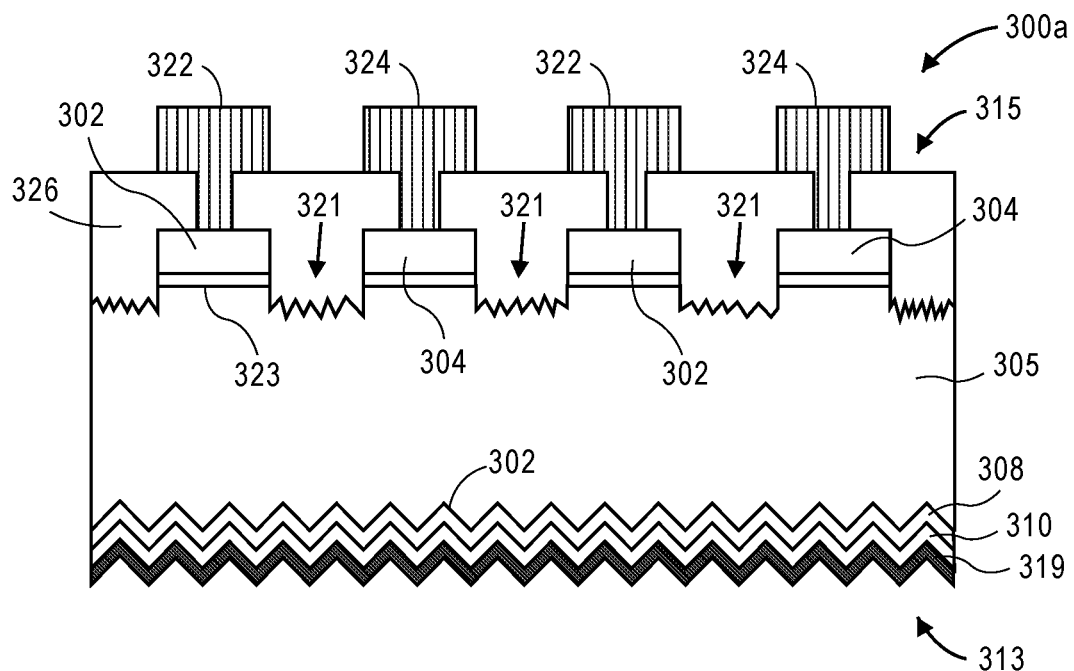
FIGS. 3A, 3B and 3C illustrate a cross-sectional views of example solar cells, according to some embodiments.
Figure 3B:
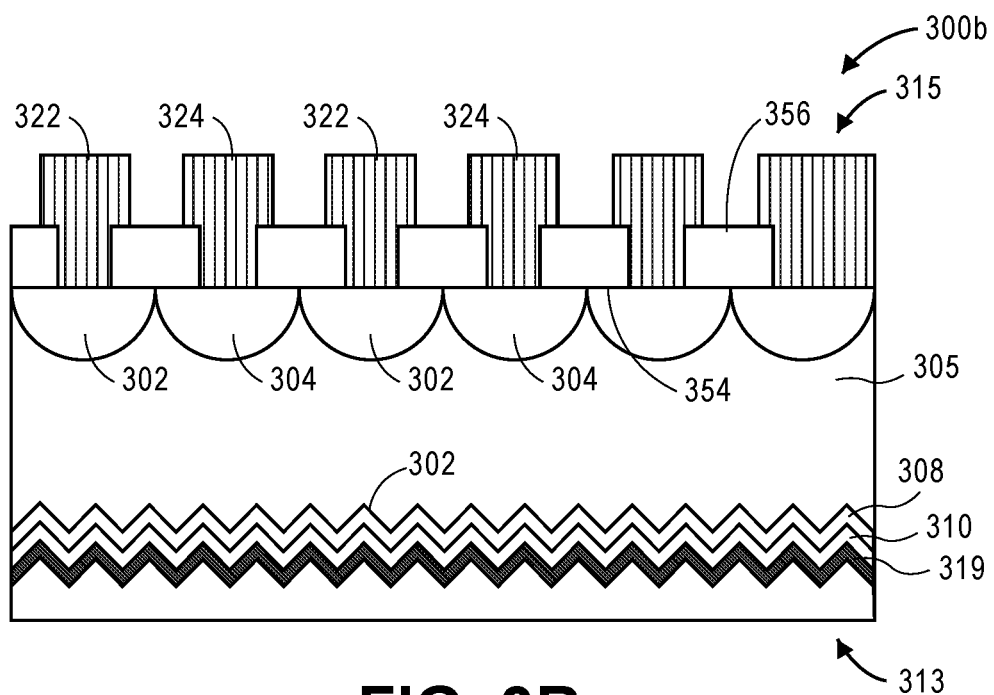

Although as shown in FIG. 2B, the first plurality of contact fingers 222 are disposed above one semiconductor region (e.g., the first semiconductor region 202), alternatively, in an embodiment, the first plurality of contact fingers 222 can be disposed above one or more semiconductor regions. In an example, the first plurality of contact fingers 222 can be disposed above the first and second semiconductor regions 202, 204, where an insulator layer can be disposed between the first plurality of contact fingers 222 and the second semiconductor region 204. Similarly, in one example, the second plurality of contact fingers 224 can be disposed above the first and second semiconductor regions 202, 204, where another insulator layer can be disposed between the second plurality of contact fingers 224 and the first semiconductor region 202. In one such example, FIG. 3B shows an example solar cell where such a structure can be used. In an embodiment, the insulator layer can include silicon dioxide or silicon nitride.

In an embodiment, a first conductive bridge 226 can be formed above the first semiconductor region 202 as shown in FIG. 2B. In one embodiment, the first conductive bridge 226 can be twice as long as a contact finger of the first plurality of contact fingers 202 or second plurality of contact fingers 204, as shown in FIG. 2B.

Figure 2C:
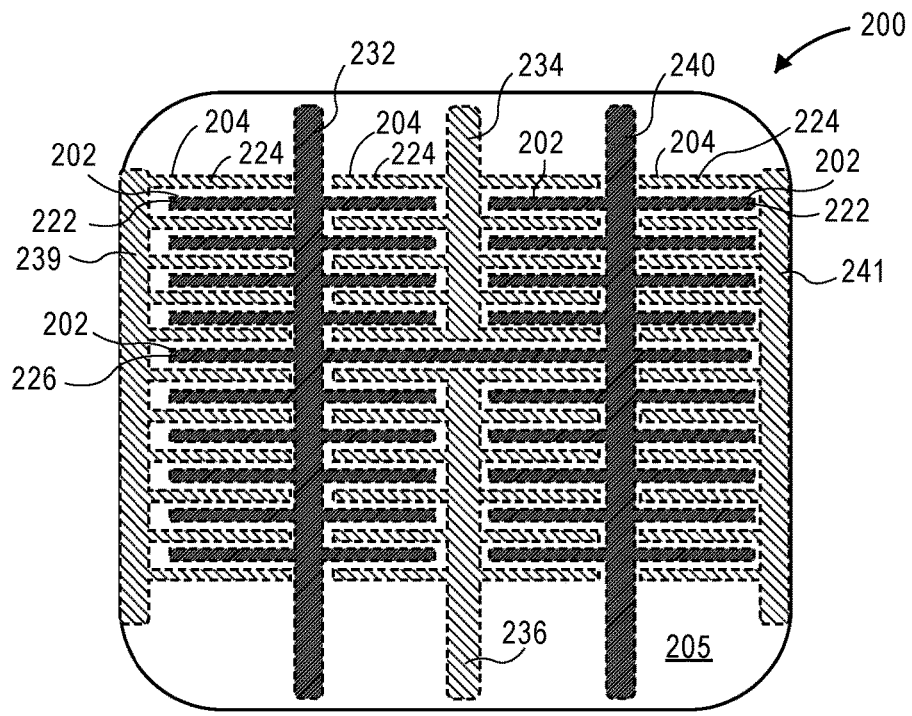

Referring to FIG. 2C and corresponding operation 108 from the flowchart 100 of FIG. 1, a first conductive busbar 232 can be formed above the first semiconductor region 202. In one embodiment, the first conductive busbar 232 can be formed above the first plurality of contact fingers 222. In an example, the first conductive busbar 232 can make direct contact to the first plurality of contact fingers 222. In one embodiment, the first conductive busbar 232 can be bonded to the first plurality of contact fingers 222. In an embodiment, the bonding can include performing a laser welding process, thermocompression process, ultrasonic bonding process, among other bonding processes to bond the first conductive busbar 232 to the first plurality of contact fingers 222.

Referring to FIG. 2C and corresponding operation 110 from the flowchart 100 of FIG. 1, a first portion of a second conductive busbar 234 can be formed above the second semiconductor region 204. In an embodiment, the first portion of the second conductive busbar 234 can be formed above the second plurality of contact fingers 224. In an example, the first portion of the second conductive busbar 234 can make direct contact to the second plurality of contact fingers 224.

Referring to FIG. 2C and corresponding operation 112 from the flowchart 100 of FIG. 1, a second portion of a second conductive busbar 236 can be formed above the second semiconductor region 204. In an embodiment, the second portion of the second conductive busbar 236 can be formed above the second plurality of contact fingers 224. In an example, the second portion of the second conductive busbar 236 can make direct contact to the second plurality of contact fingers 224. In an embodiment, a first separation region 206 can separate the first portion of the second conductive busbar 234 and the second portion of the second conductive busbar 236. In an example, the first separation region 206 can be a gap and/or a space between the first and second portions of the second conductive busbar 234, 236 as shown in FIG. 2C.

In one embodiment, the first and second portion of the second conductive busbar 234, 236 can be bonded to the second plurality of contact fingers 224. In an embodiment, bonding the first and second portion of the second conductive busbar 234, 236 to the second plurality of contact fingers 224 can include performing a laser welding process, thermocompression process, and ultrasonic bonding process, among other bonding processes to bond the first and second portion of the second conductive busbar 234, 236 to the first plurality of contact fingers 222.

Referring to FIG. 2C and corresponding operation 114 from the flowchart 100 of FIG. 1, a third conductive busbar 240 can be formed above the first semiconductor region 202. In an embodiment, the third conductive busbar 240 has a same polarity, e.g., positive or negative polarity, as the first conductive busbar 232. In one example, the first and third conductive busbars 232, 240 have a positive polarity and the first and second portions of the second conductive busbar 234, 236 has a negative polarity. In an embodiment, the third conductive busbar 240 can be formed above the first plurality of contact fingers 222. In an example, the third conductive busbar 240 can make direct contact to the first plurality of contact fingers 222. In one embodiment, the third conductive busbar 240 can be bonded to the first plurality of contact fingers 222 (e.g., through a welding, thermocompression and/or ultrasonic bonding process, among other bonding processes). In an embodiment, the third conductive busbar 240 can be a conductive foil (e.g., an aluminum foil).

Referring to FIG. 2C and corresponding operation 116 from the flowchart 100 of FIG. 1, a conductive bridge 226 can be formed. In an embodiment, the conductive bridge 226 can be formed above the first semiconductor region 202. In one embodiment, the first conductive bridge 226 can be formed above the first separation region 226, e.g., between the first and second portions of the second conductive busbar 234, 236. In an example, the first conductive bridge 226 can electrically connect the first conductive busbar 232 to the third conductive busbar 240, as shown. In an embodiment, the first conductive bridge 226 can be formed in the same process as the first and second plurality of contact fingers 222, 224. In one embodiment, the first conductive bridge 226 can include a metal seed layer and/or plated metal. In an embodiment, the first conductive bridge 226 can be a conductive foil (e.g., an aluminum foil).

As described above, in an embodiment, the first, second and/or third conductive busbars 232, 234, 236, 240 can be a conductive foil. In an embodiment, the first conductive busbar 232 can be an aluminum foil. In one example, the conductive foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment the conductive foil can be a sheet of conductive foil.

In some embodiments, the first, second and/or third conductive busbars 232, 234, 236, 240 can include the first plurality of contact fingers 222, second plurality of contact fingers 224 and the first conductive bridge 226. In an embodiment, the first and second plurality of contact fingers 222, 224 can extend from the first, second and third conductive busbars 232, 234, 236, 240, a shown. In one embodiment, the first conductive bridge 226 can extend from the first conductive busbar 232 above the first separation region 206 to electrically connect to the third conductive busbar 240. In an example, the first and second plurality of contact fingers 222, 224 can be formed in the same process as the first, second and third conductive busbars 232, 234, 236, 240. In one such embodiment, forming the first, second and third conductive busbars 232, 234, 236, 240, the first plurality of contact fingers 222, second plurality of contact fingers 224 and first conductive bridge 226 can include forming a metal seed layer. In an example, the metal seed layer can be formed using a blanket deposition process and/or a printing process (e.g., screen printing) directly on the first and second semiconductor region 202, 204. In one embodiment, forming the first, second and third conductive busbars 232, 234, 236, 240, the first plurality of contact fingers 222, second plurality of contact fingers 224 and the first conductive bridge 226 can include performing an plating process (e.g., using or including a plated metal). In an example, an electroplating process can plate metal to the metal seed layer to form the first, second and third conductive busbars 232, 234, 236, 240, the first plurality of contact fingers 222, second plurality of contact fingers 224 and first conductive bridge 226 in the structure shown in FIG. 2C. In an embodiment, the first, second and third conductive busbars 232, 234, 236, 240, the first plurality of contact fingers 222, second plurality of contact fingers 224 and the first conductive bridge 226 can include a metal such as, but not limited to aluminum, nickel, silver, cobalt, copper, titanium and tungsten.

In one such embodiment, the first, second and third conductive busbars 232, 234, 236, 240, the first and second plurality of contact fingers 222, 224, and the first conductive bridge 226 can be formed directly above the first and second semiconductor regions 202, 204, e.g., without a metal seed layer. In an example, the first, second and third conductive busbars 232, 234, 236, 240, the first and second plurality of contact fingers 222, 224 and first conductive bridge 226 is a conductive foil disposed above the first and second semiconductor regions 202, 204.

Although as shown in FIG. 2B, the first conductive busbar 232 is disposed above one semiconductor region (e.g., the first semiconductor region 202), alternatively, in an embodiment, the first conductive busbar 232 can be disposed above one or more semiconductor regions. In an example, the first conductive busbar 232 can be disposed above the first and second semiconductor regions 202, 204, where an insulator layer can be disposed between the first conductive busbar 232 and the second semiconductor region 204. Similarly, in one example, the first and second portions of the second conductive busbar 234, 236 can be disposed above the first and second semiconductor regions 202, 204, where another insulator layer can be disposed between first and second portions of the second conductive busbar 234, 236 and the first semiconductor region 202. In one example, the third conductive busbar 240 can be disposed above the first and second semiconductor regions 202, 204, where still another insulator layer can be disposed between the third conductive busbar 240 and the second semiconductor region 204. In one such example, FIG. 3B shows an example solar cell where this structure can be used. In an embodiment, the insulator layer can include silicon dioxide or silicon nitride.

Referring to FIG. 2C, edge conductive busbars 239, 241 can be formed. In an embodiment, the edge conductive busbars 239, 241 can be formed along an edge of the substrate 205, as shown. In an embodiment the edge conductive busbars 239, 241 can be formed above the second plurality of contact fingers 224. In an example, the edge conductive busbars 239, 241 can make direct contact to the second plurality of contact fingers 224. In one embodiment, the edge conductive busbars 239, 241 can be bonded to the second plurality of contact fingers 224 (e.g., through a welding, thermocompression and/or ultrasonic bonding process, among other bonding processes). In an embodiment, the edge conductive busbars 239, 241 can include a metal seed layer, a plated metal and/or conductive foil (e.g., an aluminum foil). In an embodiment, the edge conductive busbars 239, 241 can be formed in the same processes as the first, second and third conductive busbars 232, 234, 236, 240, as discussed above (e.g., blanket metal seed deposition, electroplating, conductive foil formation, etc.).

Figure 2D:
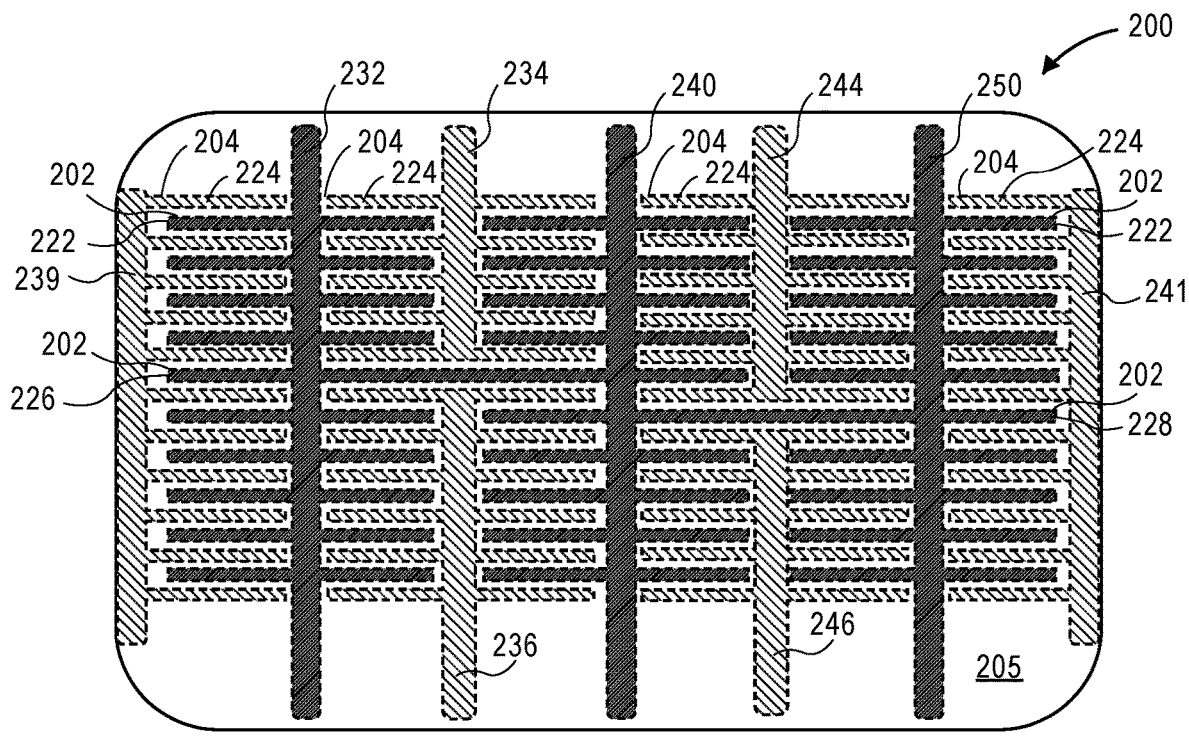
FIG. 2D illustrates a plan view of an example solar cell, according to some embodiments.

FIG. 2D illustrates an example solar cell, according to some embodiments. As shown, the solar cell 200 of FIG. 2D has similar reference numbers to elements of the solar cell 200 of FIGS. 2A, 2B and 2C, where like reference numbers refer to similar elements throughout the figures. In an embodiment, the structure of the solar cell 200 of FIG. 2D is substantially similar to the structure of the solar cell 200 of FIGS. 2A, 2B and 2C, except as described below. Unless otherwise specified below, the numerical indicators used to refer to components in FIG. 2D are similar to those used to refer to components or features in FIGS. 2A, 2B and 2C above. Therefore the description of corresponding portions of FIGS. 2A, 2B and 2C apply equally to the description of FIG. 2D, except as described below.

Referring to FIG. 2D another example solar cell 200 formed from the methods described in FIGS. 1, 2A, 2B and 2C, according to some embodiments. The solar cell 200 can include a first and second plurality of contact fingers 222, 224. The solar cell 200 can include a first conductive busbar 232, second conductive bus bar 234, 236 and a third conductive busbar 240. The second conductive busbar can have a first and second portion 234, 236, where a first separation region 206 can separate the first portion 234 and second portion 236 of the second conductive busbar. A first conductive bridge 226 can electrically connect the first and third conductive busbars 232, 240, where the first conductive bridge is formed above the first separation region 206. The solar cell 220 of FIG. 2D can also include a fourth conductive busbar having a first portion 244 and a second portion 246. A second separation region 207 can separate the first portion 244 and second portion 246 of the fourth conductive busbar. The solar cell 200 of FIG. 2D can include a fifth conductive busbar 250. The fifth conductive busbar 250 can be formed above the first plurality of contact fingers 222 and/or the first semiconductor region 202 of the substrate 205. A second conductive bridge 228 can electrically connect the third and fifth conductive busbars 240, 250, where the second conductive bridge 228 is formed above the second separation region 207. In some embodiments, the first and second conductive bridges 226, 228 are adjacent to one another, as shown. In one embodiment, the first and second conductive bridge 226, 228 are not adjacent, e.g., are positioned at separate locations on the substrate 205. Although a first, second, third, fourth and fifth conductive busbars are shown, multiple number of busbars can be used, e.g., more than 5 busbars. In an example, the solar call can include 9 conductive busbars. Although a first and second conductive bridge 226, 228 is shown, multiple conductive bridges can be used, e.g., more than two. In some embodiments, a single conductive bridge is used. In one example, a single conductive bridge can electrically connect the first, third and fifth conductive busbar.

Figure 3C:
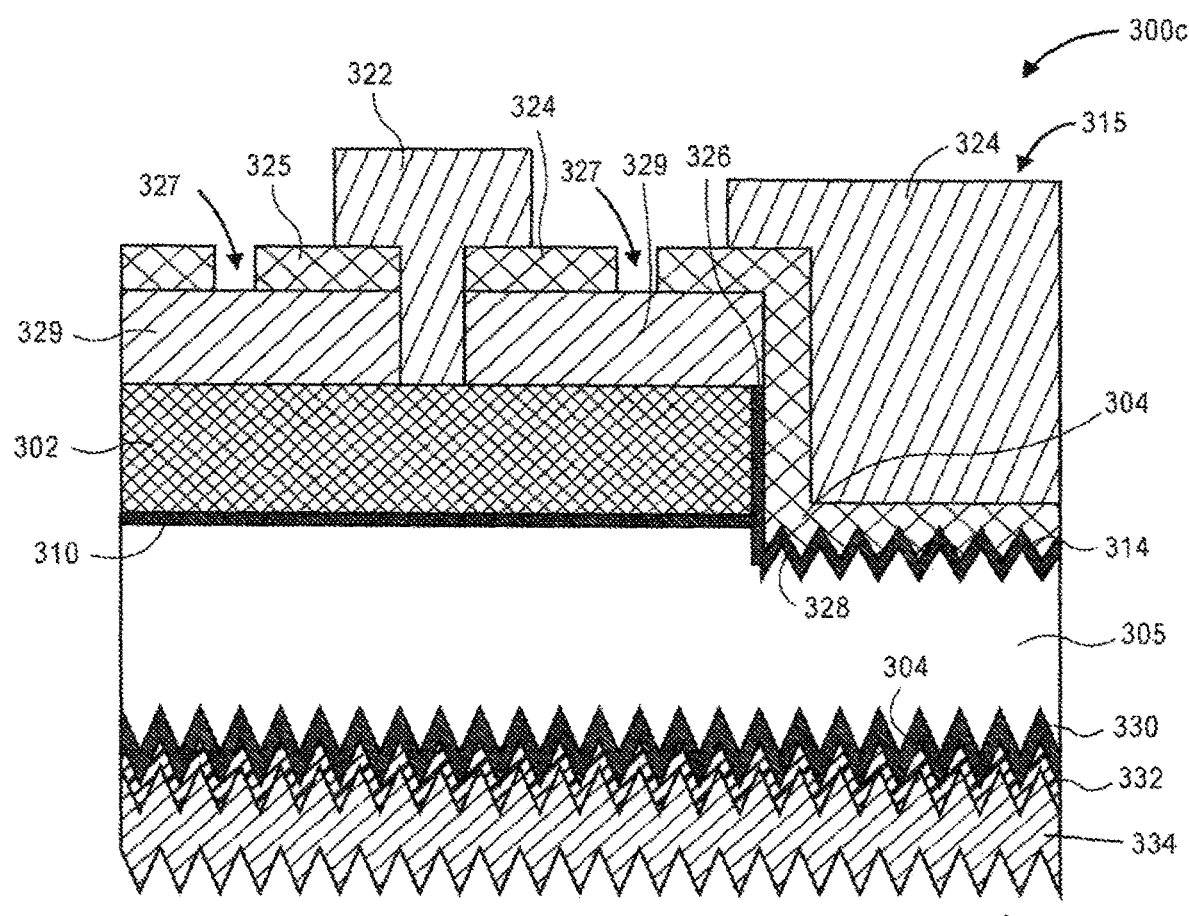

The methods and structures describes in FIGS. 1 and 2A-D can be used for semiconductor devices, for example, solar cells. FIGS. 3A, 3B and 3C illustrate example solar cells where the methods and structures of FIGS. 1 and 2A-D, can be used.

FIGS. 3A, 3B and 3C illustrate an example solar cells, according to some embodiments. As shown, the solar cells 300a, 300b, 300c of FIGS. 3A, 3B and 3C have similar reference numbers to elements of the solar cell 200 of FIGS. 2A, 2B, 2C and 2D, where like reference numbers refer to similar elements throughout the figures. In an embodiment, the structure of the solar cells 300a, 300b, 300c of FIGS. 3A, 3B and 3C are substantially similar to the structures of the solar cell 200 of FIGS. 2A, 2B, 2C and 2D, except as described below. Unless otherwise specified below, the numerical indicators used to refer to components in FIGS. 3A, 3B and 3C are similar to those used to refer to components or features in FIGS. 2A, 2B, 2C and 2D above. Therefore the description of corresponding portions of FIGS. 2A, 2B, 2C and 2D apply equally to the description of FIGS. 3A, 3B and 3C, except as described below.

FIG. 3A illustrates a cross-sectional view of an example back-contact solar cell 300a having emitter regions formed above a back surface of a substrate and where the methods and structures of FIGS. 1, 2A, 2B, 2C and 2D can be used, according to some embodiments.

Referring to FIG. 3A, a solar cell 300 includes a silicon substrate 305 having a light-receiving surface. The solar cell 300a can have a light receiving surface 313 (e.g., a front side) opposite a back side 315. A passivating dielectric layer 308 is disposed on the light-receiving surface of the silicon substrate 305. An optional intermediate material layer (or layers) 310 is disposed on the passivating dielectric layer 308. An anti-reflective coating (ARC) layer 319 is disposed on the optional intermediate material layer (or layers) 310, as shown, or is disposed on the passivating dielectric layer 308.

Referring again to FIG. 3A, on the back surface 315 of the substrate 300a, alternating first 302 and second 304 semiconductor regions are formed. In an embodiment, the first and second semiconductor regions 302, 304 can be N-type and P-type emitter regions. In one such embodiment, trenches 321 are disposed between the alternating first and second semiconductor regions 302, 304. More particularly, in an embodiment, the first semiconductor region 302 is a first polycrystalline silicon emitter region and the second semiconductor region 304 is a second polycrystalline silicon emitter region. In an embodiment, the first and second semiconductor regions 302, 304 are formed on a first portion of a thin dielectric layer 323. In on embodiment, the first polycrystalline silicon emitter region is doped with a N-type impurity and the second polycrystalline silicon emitter regions is doped with a P-type impurity. In an embodiment the thin dielectric layer 323 is tunnel dielectric layer. In one embodiment, the thin dielectric layer 323 is a silicon oxide layer having a thickness of approximately 2 nanometers or less.

FIG. 3B illustrates a cross-sectional view of an example back-contact solar cell 300b having emitter regions formed in a back surface of a substrate of a substrate and where the methods and structures of FIGS. 1, 2A, 2B, 2C and 2D can be used, according to some embodiments.

Referring to FIG. 3B, a solar cell 300b includes a silicon substrate 305 having a light-receiving surface 313. The solar cell 300b can have a light receiving surface 313 (e.g., a front side) opposite a back side 315. A passivating dielectric layer 308 is disposed on the light-receiving surface 313 of the silicon substrate 305. An optional intermediate material layer (or layers) 310 is disposed on the passivating dielectric layer 308. An antireflective coating (ARC) layer 319 is disposed on the optional intermediate material layer (or layers) 310, as shown, or is disposed on the passivating dielectric layer 308.

Referring again to FIG. 3B, on the back surface 315 of the substrate 300b, alternating first 302 and second 304 semiconductor regions are formed. In an embodiment, the first and second semiconductor regions 302, 304 can be N-type and P-type emitter regions. More particularly, in an embodiment, first semiconductor region 302 are formed within a first portion of substrate 305 and are doped with an N-type impurity. Second semiconductor region 304 can be formed within a second portion of substrate 305 and are doped with a P-type impurity.

Referring to FIG. 3C, a cross-sectional view of a portion of a back contact solar cell 300c is shown, according to some embodiments. The solar cell 300c includes a substrate 305 having a light-receiving surface 313 and a back surface 315. A first semiconductor region 302 is disposed on a first thin dielectric layer 310 disposed on the back surface 315 of the substrate 305. In an embodiment, the first semiconductor region 302 is a N-type polycrystalline silicon emitter region. A second semiconductor region 304 is disposed on a second thin dielectric layer 314 disposed on the back surface 315 of the substrate 305. In an embodiment, the second semiconductor region 304 is a P-type polycrystalline silicon emitter region. A third thin dielectric layer 326 is disposed laterally directly between the first and second semiconductor regions 302, 304. A first conductive contact structure 322 is disposed on the first semiconductor region 302. A second conductive contact structure 324 is disposed on the second semiconductor region 324.

Referring again to FIG. 3C, in an embodiment, the solar cell 300c further includes an insulator layer 329 disposed on the first semiconductor region 302. The first conductive contact structure 322 is disposed through the insulator layer 329. Additionally, a portion of the second semiconductor region 304 overlaps the insulator layer 329 but is separate from the first conductive contact structure 324. In an embodiment, an additional semiconductor region 325 (e.g., a P-type polycrystalline silicon emitter region) is disposed on the insulator layer 329, and the first conductive contact structure 322 is disposed through the additional semiconductor region 325 and through the insulator layer 329, as is depicted in FIG. 3C. In an embodiment, the additional semiconductor region 325 and the second semiconductor region 304 are formed from a same layer that is blanket deposited and then scribed to provide scribe lines 327 therein.

Referring again to FIG. 3C, in an embodiment, the solar cell 300c further includes a recess 328 disposed in the back surface 315 of the substrate 305. The recess 328 is referred to as such with respect to the back surface 315 of the solar cell 300c, in that the recess 328 has an uppermost surface recessed below the back surface 315. The second semiconductor region 304 and the second thin dielectric layer 314 are disposed in the recess 328. In one such embodiment, the recess 328 has a texturized surface, and the second semiconductor region 304 and the second thin dielectric layer 314 are conformal with the texturized surface, as is depicted in FIG. 3C. In an embodiment, then, the first semiconductor region 302 and the first thin dielectric layer 310 are disposed on a flat portion of the back surface 315 of the substrate 305, and the second semiconductor region 304 and the second thin dielectric layer 314 are disposed on a texturized portion of the back surface 315 of the substrate 305, as is depicted in FIG. 3C. It is to be appreciated, however, that other embodiments may not include a texturized surface, or may not include a recess altogether. A third thin dielectric layer 326 is disposed laterally directly between the first and second semiconductor regions 302, 304. In an embodiment, the first, second and third thin dielectric layer 310, 314 326 include silicon dioxide.

Referring again to FIG. 3C, in an embodiment, the solar cell 300c further includes a fourth thin dielectric layer 330 disposed on the light receiving surface 313 of the substrate 305. In an embodiment, the fourth thin dielectric layer 330 includes silicon dioxide. A third semiconductor layer 332 is disposed on the fourth thin dielectric layer 332. In an embodiment, the third semiconductor layer is a N-type polycrystalline silicon layer. An antireflective coating (ARC) layer 334, such as a layer of silicon nitride, is disposed on the third semiconductor layer 332. In one embodiment, the fourth thin dielectric layer 332 is formed by essentially the same process used to form the second thin dielectric layer 314.

In an embodiment, the substrate 305 is an N-type monocrystalline silicon substrate. In an embodiment, the first thin dielectric layer 310, the second thin dielectric layer 314 and the third thin dielectric layer 326 include silicon dioxide. However, in another embodiment, the first thin dielectric layer 310 and the second thin dielectric layer 314 include silicon dioxide, while the third thin dielectric layer 326 includes silicon nitride. In an embodiment, insulator layer 322 includes silicon dioxide.

Referring to FIGS. 3A, 3B and 3C, conductive contact structures 322/324 are fabricated using the methods of FIGS. 1, 2A, 2B, 2C and 2D. In an example, the conductive contact structures 322, 324 can be any of the first plurality contact fingers 222, second plurality contact fingers 204, first conductive bridge 226 and/or second conductive bridge 228. In one example, the conductive contact structures can be any of the first conductive busbar 232, second conductive busbar 234, 236, third conductive busbar 240, fourth conductive busbar 244, 246 and/or fifth conductive busbar 250 of FIGS. 2A, 2B, 2C and 2D. As described above, in an embodiment, the conductive contact structures 322/324 include metal and are formed by a deposition, lithographic, and etch approach or, alternatively, a printing or plating process or, alternatively, a foil or wire adhesion process. In an embodiment, any number of conductive contact structures, e.g., more than one, two, etc., can be used.

As such, the solar cell 200 of FIGS. 2A, 2B, 2C and 2D can have the same or substantially the same structures as described in association with the structures of the solar cell 300a of FIGS. 3A, 3B and 3C.

Figure 4A:
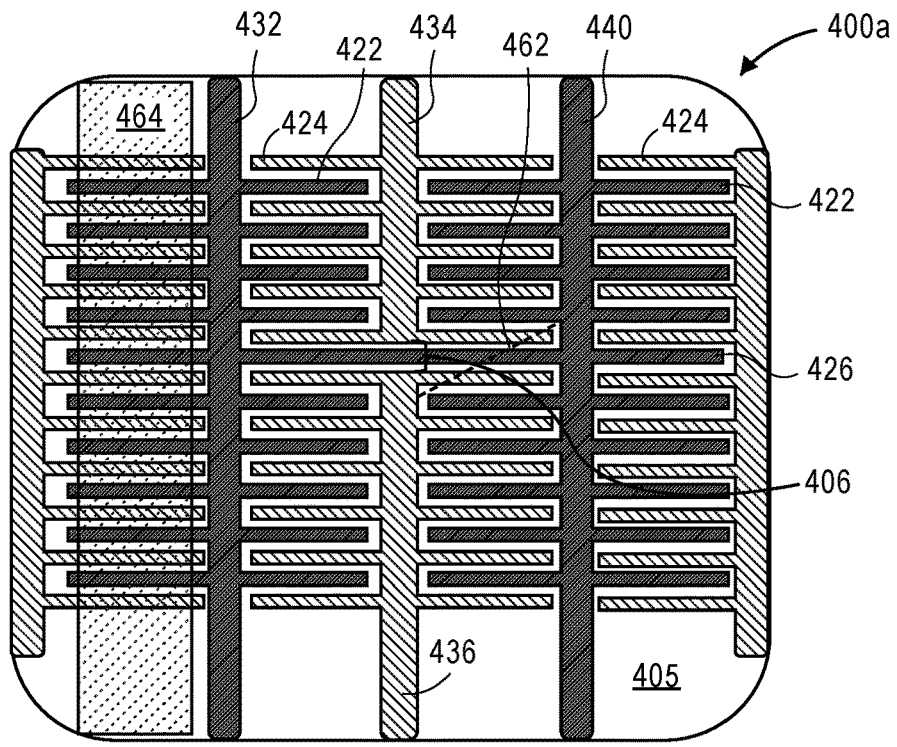
FIGS. 4A and 4B illustrates a plan view of example solar cells, according to some embodiments.
Figure 4B:
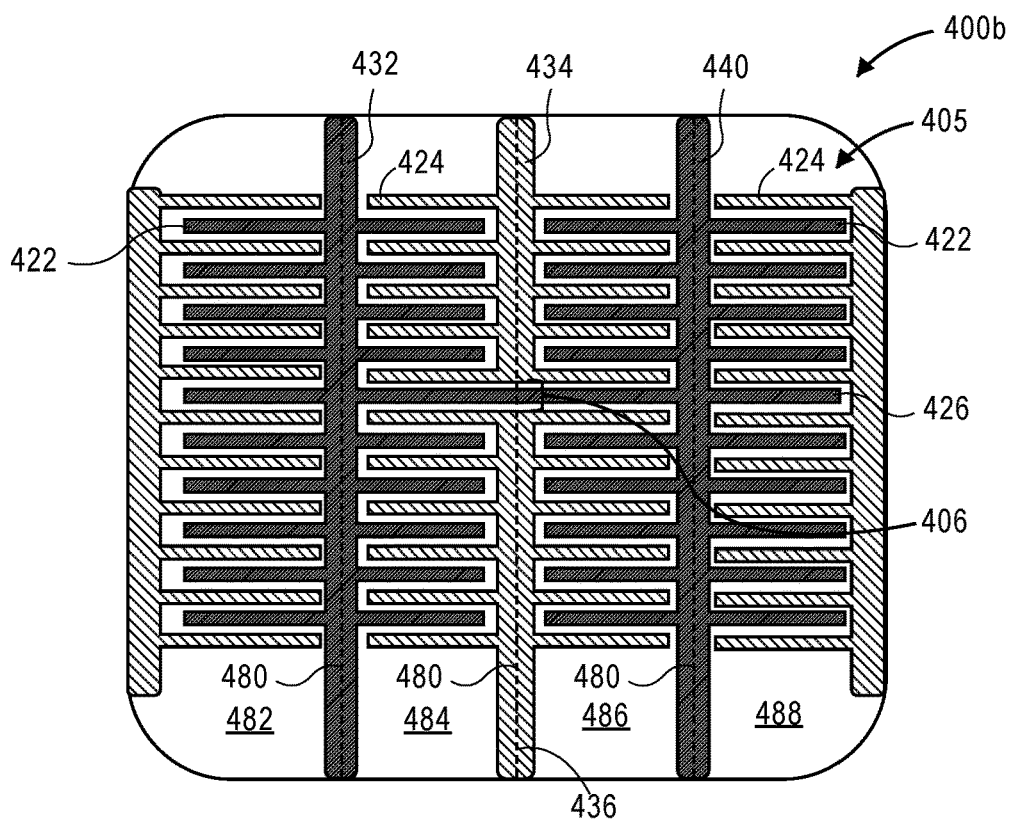

FIGS. 4A and 4B illustrate an example solar cells, according to some embodiments. As shown, the solar cells 400a, 400b of FIGS. 4A, 4B have similar reference numbers to elements of the system 200 of FIGS. 2A, 2B, 2C and 2D, where like reference numbers refer to similar elements throughout the figures. In an embodiment, the structure of the solar cell 400a, 400b of FIG. 4A, 4B is substantially similar to the structure of the solar cell 200 of FIGS. 2A, 2B, 2C and 2D, except as described below. Unless otherwise specified below, the numerical indicators used to refer to components in FIGS. 4A, 4B are similar to those used to refer to components or features in the solar cell 200 of FIGS. 2A, 2B, 2C and 2D above, except that the index has been incremented by 200. Therefore the description of corresponding portions of FIGS. 2A, 2B, 2C and 2D apply equally to the description of FIGS. 4A, 4B, except as described below.

FIG. 4A illustrates a solar cell having a local discontinuity and a shaded region, according to some embodiments. Semiconductor substrates can be prone to local discontinuities such as breakages and/or cracks and in the substrate. In an embodiment the substrate 405 can be a silicon substrate. In one such example, the silicon substrate 405 can include a local discontinuity 462, e.g., a crack, in the silicon substrate 405 as shown in FIG. 4A. As shown in FIG. 4, in one example, the local discontinuity 462 can be located between the first and third conductive busbars 432, 440 and below the first conductive bridge 426. In an embodiment, the first conductive bridge 426 electrically connects portions of the first and third conductive busbars 432, 440 on opposing sides of the local discontinuity, as shown in FIG. 4A. In an embodiment, during operation, the solar cell 400a can be partially covered and/or shaded 464. In an example, an external structure such as foliage, urban structures, dirt, grime or other objects can partially shade 264 the solar cell 400a. In an embodiment, the first conductive bridge 426 can allow for current collection to the first and third conductive busbars 432, 440 even during an operation state when the solar cell 400a is partially shaded 464. As shown in FIG. 4A, the solar cell 400a is shown to have a local discontinuity 462 and a shaded region 464, in some embodiments, solar cells can have either a shaded region or a local discontinuity where one is not required for the other to occur. FIG. 4A is shown as an embodiment to exemplify some of the advantages of the structures and/or methods of the present disclosure.

Referring to FIG. 4B another example solar cell 400b formed from the methods described in FIGS. 1, 2A, 2B, 2C and 2D, according to some embodiments. In one embodiment, the metallization structure of the solar cell 400b of FIG. 4B is a monolithic metallization structure. In an example, the solar cell 400b of FIG. 4B has been singulated or diced to provide a solar cell 400b having a first, second, third and fourth sub-cells 482, 484, 486, 488 which are physically separated from one another. In one 23 embodiment, the solar cell 400b is singulated using laser ablation. In an embodiment, a resulting groove 480 is formed upon singulation, as is depicted in FIG. 4B. In an embodiment, as is also depicted in FIG. 4B, a first conductive busbar 432 can electrically connect the first and second sub-cells 482, 484. In one embodiment, a first and second portion of a second conductive busbar 434, 436 (with contact fingers 424) can connect the second and third sub-cells 484, 486. In an embodiment, a third conductive busbar 440 can electrically connect the third and fourth sub-cells 486, 488. In one embodiment, the first, second, third and fourth sub-cells 482, 484, 486,488 provide series or parallel diode structures. In an embodiment, a first conductive bridge 426 can electrically connect a plurality of sub-cells together. In one example, as shown in FIG. 4B, the first conductive bridge 426 can electrically connect a pair of sub-cells, e.g., the first and second sub-cells 482, 484 to the third and fourth sub-cells 486, 488. In contrast, in a solar cell having a monolithic metallization structure without a conductive bridge, the electrical connection between a third sub-cell to a first sub-cell would be a series or parallel electrical connection through a second sub-cell. In an embodiment, the first conductive bridge 426 allows for an electrical connection between the first sub-cell 482 to the third 486 and fourth sub-cells 488, e.g., electrically bypassing the second sub-cell 484. In an embodiment, the first conductive bridge 426 can be useful in a state where the second sub-cell 484 is shaded or none operational, where the first conductive bridge 426 can allow for current to flow past the second sub-cell 484 directly to the third and fourth sub-cells 486, 488 from the first sub-cell 482.

Figure 5:
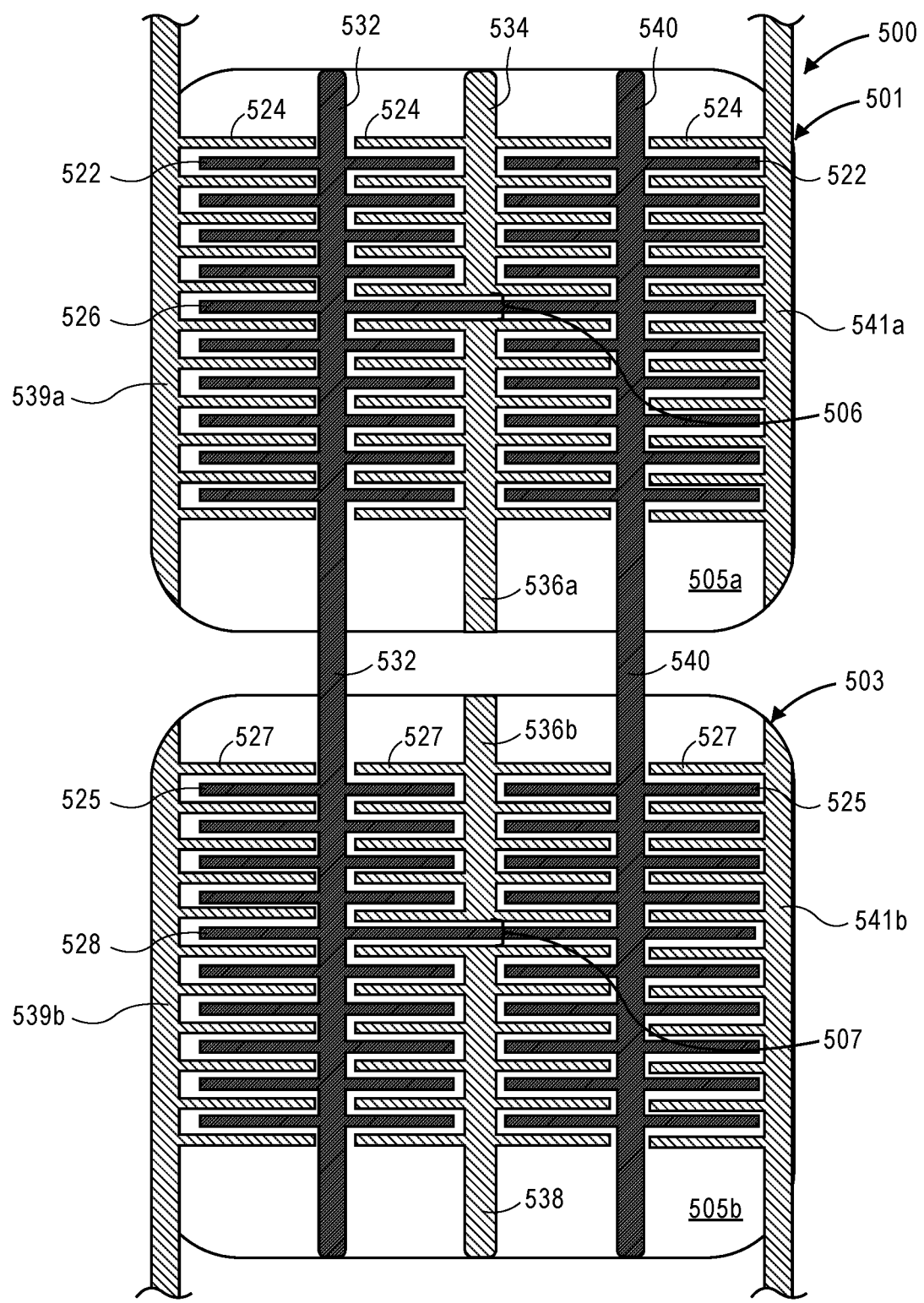
FIG. 5 illustrates a plan view of an example photovoltaic (PV) string, according to some embodiments.

Referring to FIG. 5, there is shown a photovoltaic (PV) string, according to some embodiments. In an embodiment, as shown, the photovoltaic (PV) string 500 can include a first and second solar cells 501, 503. As shown, the solar cells 501, 503 of FIG. 5 have similar reference numbers to elements of the solar cells of FIGS. 2A-D, 4A and 4B, where like reference numbers refer to similar elements throughout the figures. In an embodiment, the structure of the solar cells 501, 503 of FIG. 5 are substantially similar to the structure of the solar cells of FIGS. 2A-D, 4A and 4B, except as described below. Unless otherwise specified below, the numerical indicators used to refer to components in FIG. 5 are similar to those used to refer to components or features in the solar cell 200 of FIGS. 2A, 2B, 2C and 2D above, except that the index has been incremented by 300. Therefore the description of corresponding portions of FIGS. 2A-D, 4A and 4B apply equally to the description of FIG. 5, except as described below.

In an embodiment, the first solar cell 501 can include a first substrate 505a having a first semiconductor region and a second semiconductor region disposed on the back side of the first solar cell 501. In an embodiment, a first plurality of contact fingers 522 are disposed above the first semiconductor region of the first substrate 505a. In an embodiment, a second plurality of contact fingers 524 are disposed above the second semiconductor region of the first substrate 505a.

In an embodiment, the second solar cell 503 can include a second substrate 505b having a first semiconductor region and a second semiconductor region disposed above the back side of the second solar cell 503. In an embodiment, a first plurality of contact fingers 525 are disposed above the first semiconductor region of the second substrate 505b. In an embodiment, a second plurality of contact fingers 527 are disposed above the second semiconductor region of the second substrate 505b.

In an embodiment, a first conductive interconnect 532 is disposed above the first plurality of contact fingers 522, 525 of the first and second solar cells 501, 503. In one embodiment, a first portion 534 of a second conductive interconnect is disposed above the second plurality of contact fingers 524 of the first solar cell 501. In an embodiment, a second portion 536a of the second conductive interconnect is disposed above the second plurality of contact fingers 524 of the first solar cell 501 where a first separation region 506 of the first solar cell 501 separates the second portion 536a and the first portion 534 of the second conductive interconnect. In one embodiment, a first conductive bridge 526 is disposed above a first separation region 506, as shown. In one embodiment, a third portion 536b of a second conductive interconnect is disposed above the second plurality of contact fingers 527 of the second solar cell 503. In an embodiment, a fourth portion 538 of the second conductive interconnect is disposed above the second plurality of contact fingers 527 of the second solar cell 503, where a second separation region 507 of the second solar cell 503 separates the third portion 536b and the fourth portion 538 of the second conductive interconnect. In one embodiment, a second conductive bridge 528 is disposed above the second separation region 507.

In an embodiment, a third conductive interconnect 540 is disposed above the first plurality of contact fingers 522, 525 of the first and second solar cells 501, 503. In an embodiment, the first conductive bridge 526 electrically connects the first conductive interconnect 532 to the third conductive interconnect 540. In one embodiment, the second conductive bridge 528 electrically connects the first conductive interconnect 532 to the third conductive interconnect 540. Although, multiple conductive bridges are shown, e.g., a first 526, second 528, third, etc., in some embodiments a single conductive bridge can be used. In one such example, only the first conductive bridge 526 or second conductive bridge 528 is used.

As used herein, "interconnect" can be interchangeably with "busbar", where an interconnect here describes a metal structure that also electrically connects multiple substrates together in addition to connecting contact fingers within a single substrate (e.g., solar cell). In an embodiment, multiple configurations can be used. Referring to FIG. 5, in an example, the first and third conductive interconnects 532, 540 can electrically connect the first solar cell 501 to the second solar cell 503. In one example, a conductive foil can be used to electrically connect multiple busbars of one solar cell to another solar cell in a similar configuration as shown in FIG. 5.

In an embodiment, the first, second and third conductive interconnect 532, 534, 536a, 536b, 538, 540, the first and second plurality of contact fingers 522, 524, 525, 527 and the first and second conductive bridges 526, 528 can include a metal seed region. In an embodiment, the first, second and third conductive interconnect 532, 534, 536a, 536b, 538, 540, the first and second plurality of contact fingers 522, 524, 525, 527 and the first and second conductive bridges 526, 528 can include a metal such as, but not limited to aluminum, nickel, silver, cobalt, copper, titanium and tungsten. In one embodiment, the first, second and third conductive busbars 532, 534, 536a, 536b, 538, 540, can be a conductive foil, e.g., an aluminum foil, as described above. In one embodiment, contact fingers of one polarity of the first solar cell 501 can be connected to contact fingers of an opposite polarity of the second solar cell 503 by the first, second and third conductive interconnects 532, 534, 536a, 536b, 538, 540. Referring to FIG. 5, in one such example, the positive polarity contact fingers (e.g., 522) of the first solar cell 501 can be connected to the negative polarity contact fingers (e.g., 525) of the second solar cell 503 by the first and third conductive interconnects 532, 540. In an example, the first and second plurality of contact fingers 522, 524 of the first solar cell 501 can have an opposite polarity to the polarity to the first and second plurality of contact fingers 525, 527 of the second solar cell 503.

In one embodiment, as shown in FIG. 5, the photovoltaic (PV) string 500 can include edge conductive interconnects 539a, 541a, 539b, 541b e.g., similar to the edge conductive busbars 239, 241 of FIGS. 2C, 2D. In an embodiment, the edge conductive interconnects 539a, 541a, 539b, 541b can be disposed along an edge of the first solar cell 501 and/or the second solar cell 503, as shown. In an example the edge conductive interconnects 539a, 541a can be disposed above or directly connected to the second plurality of contact fingers 524 of the first solar cell 501. In one example, the edge conductive interconnects 539b, 541b can be disposed above or directly connected to the second plurality of contact fingers 527 of the second solar cell 503. In an embodiment, the edge conductive interconnects 539a, 541a, 539b, 541b can be bonded to the second plurality of contact fingers 524 of the first solar cell 501 and/or the second plurality of contact fingers 527 of the second solar cell 503 (e.g., through a welding, thermocompression and/or ultrasonic bonding process, among other bonding processes). In an embodiment, the edge conductive interconnects 539a, 541a, 539b, 541b, 539b can include a metal seed layer, a plated metal and/or conductive foil (e.g., an aluminum foil). In an embodiment, the edge conductive interconnects 539a, 541a, 539b, 541b can be formed in the same processes as the first, second and third conductive interconnects 532, 534, 536, 540, as discussed above (e.g., blanket metal seed deposition, electroplating, conductive foil formation, etc.).

As used herein, "interconnect" can be interchangeably with "busbar", where an interconnect here describes a metal structure that also electrically connects multiple substrates together in addition to connecting contact fingers within a single substrate (e.g., solar cell). In an embodiment, multiple configurations can be used. In one example, the edge conductive interconnects 539a, 541a, can electrically connect the first solar cell 501 to another solar cell (e.g., not shown). In an example, the edge conductive interconnects 539b, 541b can electrically connect the second solar cell 503 still another solar cell (e.g., also not shown). In one such example, FIG. 6 shows an example photovoltaic (PV) string where edge conductive interconnects can electrically connect solar cells.

Figure 6:
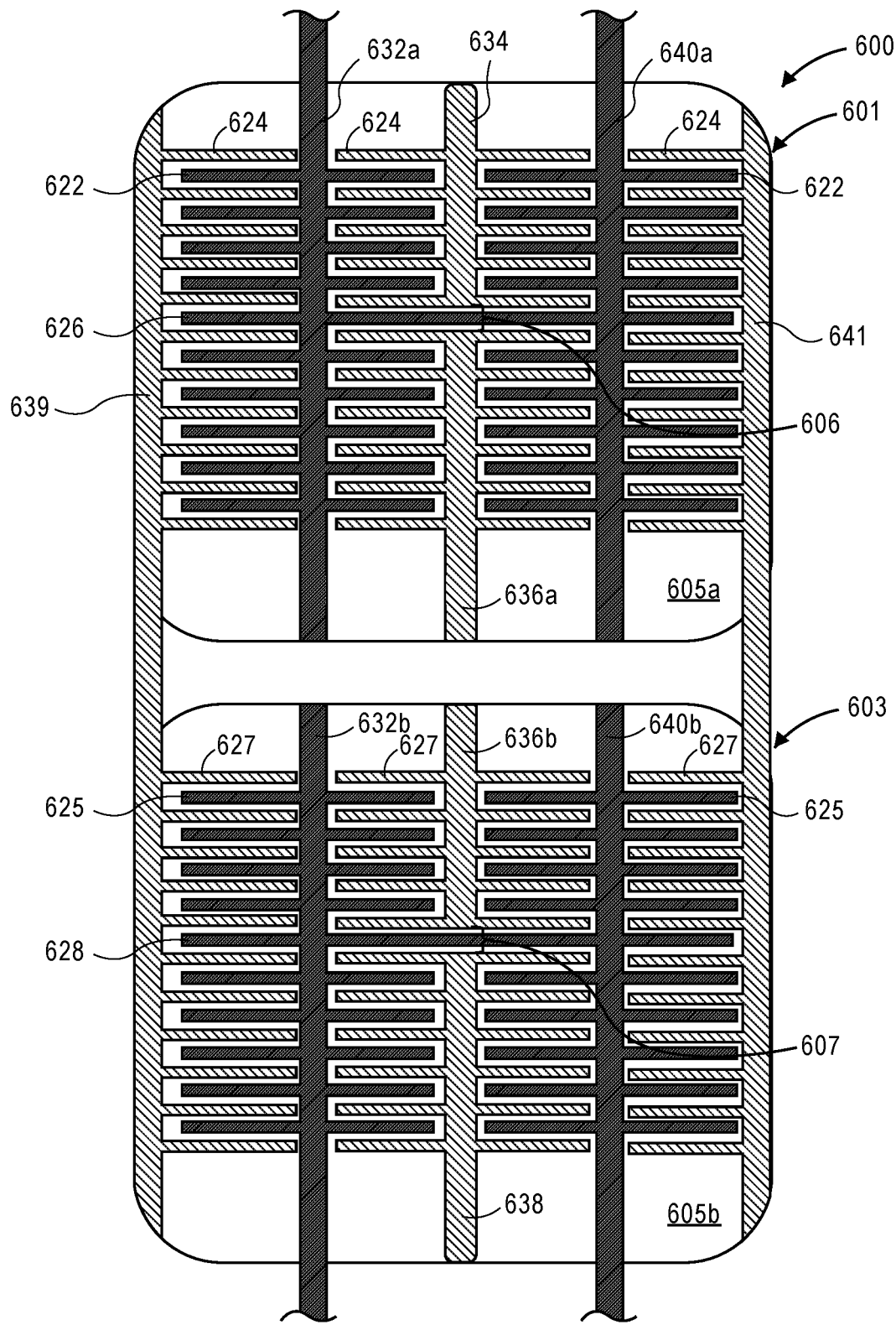
FIG. 6 illustrates a plan view of another example photovoltaic (PV) string, according to some embodiments.

Referring to FIG. 6, there is shown another photovoltaic (PV) string, according to some embodiments. As shown, the photovoltaic (PV) string 600 of FIG. 6 has similar reference numbers to elements of the photovoltaic (PV) string 500, where like reference numbers refer to similar elements throughout the figures. In an embodiment, the structure of the photovoltaic (PV) string 600 of FIG. 6 is substantially similar to the structure of the photovoltaic (PV) string 500 of FIG. 5, except as described below. Unless otherwise specified below, the numerical indicators used to refer to components in FIG. 6 are similar to those used to refer to components or features in the photovoltaic (PV) string 500 of FIG. 5 above, except that the index has been incremented by 100. Therefore the description of corresponding portions of FIG. 5 applies equally to the description of FIG. 6, except as described below. In an example, the photovoltaic (PV) string 600 can include a first and second solar cells 601, 603 similar to the first and second solar cells 501, 503 of the photovoltaic (PV) string 500 of FIG. 5.

In one embodiment, as shown in FIG. 6, the photovoltaic (PV) string 600 can include edge conductive interconnects 639, 641. In an embodiment, the edge conductive interconnects 639, 641, can electrically connect the first solar cell 601 to the second solar cell 603, as shown. In an embodiment, the edge conductive interconnects 639, 641 can be disposed along an edge of the first solar cell 601 and/or the second solar cell 603. In one embodiment, the edge conductive interconnects 639, 641 can be disposed above or directly connected to the second plurality of contact fingers 624, 627 of the first and second solar cell 601, 603. In an embodiment, contact fingers of one polarity of the first solar cell 601 can be connected to contact fingers of an opposite polarity of the second solar cell 603 using the edge conductive interconnects 639, 641 (e.g., positive polarity contact fingers of the first 601 cell are connected to negative polarity contact fingers of the second solar cell 603). In one such example, the first and second plurality of contact fingers 622, 624 of the first solar cell 601 have an opposite polarity to the polarity to the first and second plurality of contact fingers 625, 627 of the second solar cell 603.

In an embodiment, the PV string 600 can include a first conductive interconnect 632a disposed above the first plurality of contact fingers 622 of the first solar cells 601. In one embodiment, a first portion 634 of a second conductive interconnect is disposed above the second plurality of contact fingers 624 of the first solar cell 601. In an embodiment, a second portion 636a of the second conductive interconnect is disposed above the second plurality of contact fingers 624 of the first solar cell 601, where a first separation region 606 of the first solar cell 601 separates the second portion 636a and the first portion 634 of the second conductive interconnect. In one embodiment, a first conductive bridge 626 is disposed above a first separation region 606, as shown. In one embodiment, a third portion 636b of a second conductive interconnect is disposed above the second plurality of contact fingers 627 of the second solar cell 603. In an embodiment, a fourth portion 638 of the second conductive interconnect is disposed above the second plurality of contact fingers 627 of the second solar cell 603, where a second separation region 607 of the second solar cell 603 separates the third portion 636b and the fourth portion 638 of the second conductive interconnect. In one embodiment, a second conductive bridge 628 is disposed above the second separation region 607.

In an embodiment, a third conductive interconnect 640a is disposed above the first plurality of contact fingers 622 of the first solar cell 601. In an embodiment, the first conductive bridge 626 electrically connects the first conductive interconnect 632a to the third conductive interconnect 640a. In an embodiment, a fourth and fifth conductive interconnect 632b, 640b are disposed above the first plurality of contact fingers 622 of the second solar cell 603. In one embodiment, the second conductive bridge 628 electrically connects the fourth conductive interconnect 632b to the fifth conductive interconnect 640b. Although, multiple conductive bridges are shown, e.g., a first 626, second 628, third, etc., in some embodiments a single conductive bridge can be used. In one such example, only the first conductive bridge 626 or second conductive bridge 628 is used.

In one embodiment, conductive interconnects 632a, 640a, can electrically connect the first solar cell 601 to another solar cell (e.g., not shown). In an example, conductive interconnects 632b, 640b can electrically connect the second solar cell 603 still another solar cell (e.g., also not shown). In one such example, FIG. 5 shows an example PV string where conductive interconnects can electrically connect solar cells. In contrast to FIG. 5, the photovoltaic (PV) string 600 of FIG. 6 includes solar cells 601, 603 electrically connected by the edge conductive interconnects 639, 641.

In an embodiment, the configuration of the PV string 600 shown in FIG. 6 can be used in combination with the configuration of the PV string 500 shown in FIG. 5, e.g., to form a photovoltaic (PV) superstring where multiple solar cells are connected via conductive interconnects and edge conductive interconnects. In an example, a first solar cell can be connected to a second solar cell by conductive interconnects, as shown in FIG. 5, and a third solar cell can be connected to the second solar cell by edge conductive interconnects, as shown in FIG. 6. Multiple configurations can be used, e.g., more than two, three, four solar cells can be electrically connected. In an embodiment, the configurations presented in the PV strings 500, 600 of FIGS. 5 and 6 can be used together to form a superstring used in a photovoltaic (PV) module.

The methods and structures describes in FIGS. 1 and 2A-D, 4A, 4B, 5 and 6 can be used for semiconductor devices, for example, solar cells. FIGS. 3A, 3B and 3C illustrate example solar cells where the methods and structures of FIGS. 1 and 2A-D, 4A, 4B, 5 and 6 can be used.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, the solar cell having a front side which faces the sun during normal operation and a back side opposite the front side, the solar cell comprising:
   a substrate having a first semiconductor region and a second semiconductor region disposed in or above the back side of the solar cell;
   a first conductive busbar disposed above the first semiconductor region and extending in a first direction and including a plurality of first conductive fingers extending in a second direction that is orthogonal to the first direction;
   a second conductive busbar including a first portion and a second portion disposed above the second semiconductor region and extending in the first direction and including a plurality of second conductive fingers extending in the second direction, wherein a first separation region separates the first and second portions of the second conductive busbar;
   a third conductive busbar disposed above the first semiconductor region and extending in the first direction and including a plurality of third conductive fingers extending in the second direction, wherein the plurality of first and the plurality of second conductive fingers form an alternating pattern in the first direction, and the plurality of second and the plurality of third conductive fingers form another alternating pattern in the first direction; and
   a first conductive bridge electrically connecting the first conductive busbar to the third conductive busbar and extending in the second direction, wherein the first conductive bridge extends beyond sides of the first conductive busbar and the third conductive busbar, the first conductive bridge including one of the plurality of first conductive fingers and one of the plurality of third conductive fingers.

2. The solar cell of claim 1, further comprising:
   a first portion of a fourth conductive busbar disposed above the second semiconductor region;
   a second portion of the fourth conductive busbar disposed above the second semiconductor region, wherein a second separation region separates the second portion and the first portion of the fourth conductive busbar;
   a fifth conductive busbar disposed above the first semiconductor region; and
   a second conductive bridge electrically connecting the third conductive busbar to the fifth conductive busbar, wherein the second conductive bridge is disposed above the second separation region.

3. The solar cell of claim 1, wherein the first, second and third conductive busbars comprise a seed metal layer.

4. The solar cell of claim 1, wherein the first, second and third conductive busbars comprise a plated metal or a conductive foil.

5. The solar cell of claim 1, wherein the first, second and third conductive busbars comprise a metal selected from the group consisting of aluminum, nickel, silver, cobalt, copper, titanium and tungsten.

6. The solar cell of claim 1, wherein the first and third conductive busbars have the same polarity.

7. The solar cell of claim 1, wherein the first and third conductive busbars have a positive polarity and the first and second portions of the second conductive busbar has a negative polarity.

8. The solar cell of claim 1, further comprising a local discontinuity in the substrate located between the first and third conductive busbars and below the first conductive bridge.

9. The solar cell of claim 8, wherein the first conductive bridge electrically connects portions of the first and third conductive busbar on opposing sides of the local discontinuity.

10. A solar cell, the solar cell having a front side which faces the sun during normal operation and a back side opposite the front side, the solar cell comprising:
   a substrate having a first semiconductor region and a second semiconductor region disposed in or above the back side of the solar cell;
   a first conductive busbar disposed above the first semiconductor region and extending in a first direction and including a plurality of first conductive fingers extending in a second direction that is orthogonal to the first direction;
   a second conductive busbar including a first portion and a second portion disposed above the second semiconductor region and extending in the first direction and including a plurality of second conductive fingers extending in the second direction, wherein a first separation region separates the first and second portions of the second conductive busbar;
   a third conductive busbar disposed above the first semiconductor region and extending in the first direction and including a plurality of third conductive fingers extending in the second direction, wherein the plurality of first and the plurality of second conductive fingers form an alternating pattern in the first direction, and the plurality of second and the plurality of third conductive fingers form another alternating pattern in the first direction;
   a first conductive bridge electrically connecting the first conductive busbar to the third conductive busbar and extending in the second direction, wherein the first conductive bridge extends beyond sides of the first conductive busbar and the third conductive busbar, the first conductive bridge including one of the plurality of first conductive fingers and one of the plurality of third conductive fingers; and
   a second conductive bridge aligned to the first conductive bridge in the first direction and offset from the first conductive bridge in the second direction.

11. The solar cell of claim 10, further comprising: a first portion of a fourth conductive busbar disposed above the second semiconductor region;
   a second portion of the fourth conductive busbar disposed above the second semiconductor region, wherein a second separation region separates the second portion and the first portion of the fourth conductive busbar; and
   a fifth conductive busbar disposed above the first semiconductor region.

12. The solar cell of claim 10, wherein the first, second and third conductive busbars comprise a seed metal layer.

13. The solar cell of claim 10, wherein the first, second and third conductive busbars comprise a plated metal or a conductive foil.

14. The solar cell of claim 10, wherein the first, second and third conductive busbars comprise a metal selected from the group consisting of aluminum, nickel, silver, cobalt, copper, titanium and tungsten.

15. A solar cell, the solar cell having a front side which faces the sun during normal operation and a back side opposite the front side, the solar cell comprising:
   a substrate having a first semiconductor region and a second semiconductor region disposed in or above the back side of the solar cell;
   a first conductive busbar disposed above the first semiconductor region and extending in a first direction and including a plurality of first conductive fingers extending in a second direction that is orthogonal to the first direction;
   a second conductive busbar including a first portion and a second portion disposed above the second semiconductor region and extending in the first direction and including a plurality of second conductive fingers extending in the second direction, wherein a groove is along a direction parallel to the first direction;
   a third conductive busbar disposed above the first semiconductor region and extending in the first direction and including a plurality of third conductive fingers extending in the second direction, wherein the plurality of first and the plurality of second conductive fingers form an alternating pattern in the first direction, and the plurality of second and the plurality of third conductive fingers form another alternating pattern in the first direction; and
   a first conductive bridge electrically connecting the first conductive busbar to the third conductive busbar and extending in the second direction, wherein the first conductive bridge extends beyond sides of the first conductive busbar and the third conductive busbar, the first conductive bridge including one of the plurality of first conductive fingers and one of the plurality of third conductive fingers.

16. The solar cell of claim 15, further comprising: a first portion of a fourth conductive busbar disposed above the second semiconductor region;
   a second portion of the fourth conductive busbar disposed above the second semiconductor region, wherein a second groove separates the second portion and the first portion of the fourth conductive busbar;
   a fifth conductive busbar disposed above the first semiconductor region; and
   a second conductive bridge electrically connecting the third conductive busbar to the fifth conductive busbar, wherein the second conductive bridge is disposed above the second groove.

17. The solar cell of claim 15, wherein the first, second and third conductive busbars comprise a seed metal layer.

18. The solar cell of claim 15, wherein the first, second and third conductive busbars comprise a plated metal or a conductive foil.

19. The solar cell of claim 15, wherein the first, second and third conductive busbars comprise a metal selected from the group consisting of aluminum, nickel, silver, cobalt, copper, titanium and tungsten.

20. The solar cell of claim 11, wherein the second conductive bridge couples the fifth conductive busbar and the third conductive busbar.

* * * * *